(12) United States Patent
Redilla

(10) Patent No.: US 6,208,258 B1
(45) Date of Patent: Mar. 27, 2001

(54) CIRCUIT AND METHOD FOR DETERMINING WHETHER AC MAINS VOLTAGE IS BELOW OR ABOVE A PREDETERMINED SET POINT

(75) Inventor: Jack A. Redilla, Sheffield Lake, OH (US)

(73) Assignee: Core Technology, Inc., Westlake, OH (US)

( * ) Notice: Subject to any disclaimer, the term of this patent is extended or adjusted under 35 U.S.C. 154(b) by 0 days.

(21) Appl. No.: 09/409,335

(22) Filed: Sep. 30, 1999

Related U.S. Application Data

(60) Provisional application No. 60/102,453, filed on Sep. 30, 1998.

(51) Int. Cl.[7] .................................................. G08B 21/00
(52) U.S. Cl. ...................... 340/660; 340/661; 340/635; 340/663; 361/86; 323/284; 363/17; 363/19
(58) Field of Search .................................. 340/660, 661, 340/663, 635; 361/86, 936; 323/284; 363/17, 19

(56) References Cited

U.S. PATENT DOCUMENTS

| | | | | |
|---|---|---|---|---|
| 3,947,752 | * | 3/1976 | Morgan | 323/17 |
| 4,524,411 | * | 6/1985 | Willis | 363/21 |
| 5,555,483 | * | 9/1996 | Pressman et al. | 361/90 |
| 5,579,197 | * | 11/1996 | Mengelt | 361/93 |
| 6,108,219 | * | 8/2000 | French | 363/23 |

* cited by examiner

*Primary Examiner*—Julie Lieu
(74) *Attorney, Agent, or Firm*—Renner, Otto, Boisselle & Sklar LLP

(57) ABSTRACT

A circuit for detecting whether or not an AC voltage mains is providing an AC voltage above a predetermined point including a full wave bridge and voltage divider, a voltage detection circuit including a pair of transistors and a zener diode, an optical coupler including a light emitting diode (LED) and photo transistor, a comparator circuit for determining whether or not the AC voltage source has been below a predetermined voltage for a predetermined length of time including a comparator circuit such as a comparator or a FET.

25 Claims, 3 Drawing Sheets

CIRCUIT AND METHOD FOR DETERMINING WHETHER AC MAINS VOLTAGE IS BELOW OR ABOVE A PREDETERMINED SET POINT

CROSS-REFERENCES TO RELATED APPLICATIONS

This application claims the benefit of U.S. Provisional Patent Application Ser. No. 60/102,453, filed Sep. 30, 1998, the entire disclosure of which is incorporated by reference.

TECHNICAL FIELD OF INVENTION

This invention relates to power supply circuitry operating from AC mains, and to a circuit which determines whether the AC mains voltage is below or above a predetermined set point.

BACKGROUND OF THE INVENTION

Electrical power from AC mains is used to provide a source of energy for numerous devices. Unfortunately, the electrical power provided by AC mains may be interrupted either partially (e.g., brown out) or wholly (e.g., power failure). Recognizing this problem, prior art power supply circuits have included voltage level detection and time period detection so as to determine when power is lost and whether the duration is temporary or more permanent. These prior art circuits either required a separate Vcc power supply or used excessive amounts of power from the AC mains. Accordingly, there is a strong need in the art for a simple, inexpensive and energy efficient manner for detecting the loss of the AC mains in a power supply circuit.

SUMMARY OF THE INVENTION

The present invention provides a novel circuit and method for determining whether an AC mains voltage is below or above a predetermined set point. Initially the circuit rectifies the voltage of the AC mains and reduces the voltage with a voltage divider. The rectification of the AC voltage of the AC mains allows the circuit of the present invention to detect both the positive half and the negative half of the AC mains voltage signal. A level sensitive trigger circuit receives the reduced voltage. When the level sensitive trigger circuit senses that the voltage is above the predetermined set point, the level sensitive trigger circuit fires by generating a pulse which is conveyed to a comparator circuit by an isolator such as a photo coupler. The comparator circuit determines a duration since a pulse has been generated and indicates a power failure when the duration exceeds certain period of time.

The method and circuit of the present invention eliminates the need to have either a separate Vcc power supply for the circuit in relation to the AC mains, or the need to draw excessive amounts of power from the AC mains. Additionally, since the signal indicating whether the AC mains has been interrupted is separated from the AC mains by an isolator, the need to separately isolate this signal from the AC mains is eliminated. Accordingly an improved circuit for detecting failure of an AC mains is provided by the present invention.

To accomplish the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

The present invention will now be described more fully with reference to the accompanying drawings in which several embodiments of the invention are shown. The present invention, however, may be embodied in many different forms and should not be construed as limited to the embodiment shown. The several embodiments described are provided.

DETAILED DESCRIPTION OF THE PREFERRED EMBODIMENTS

Figure 1:
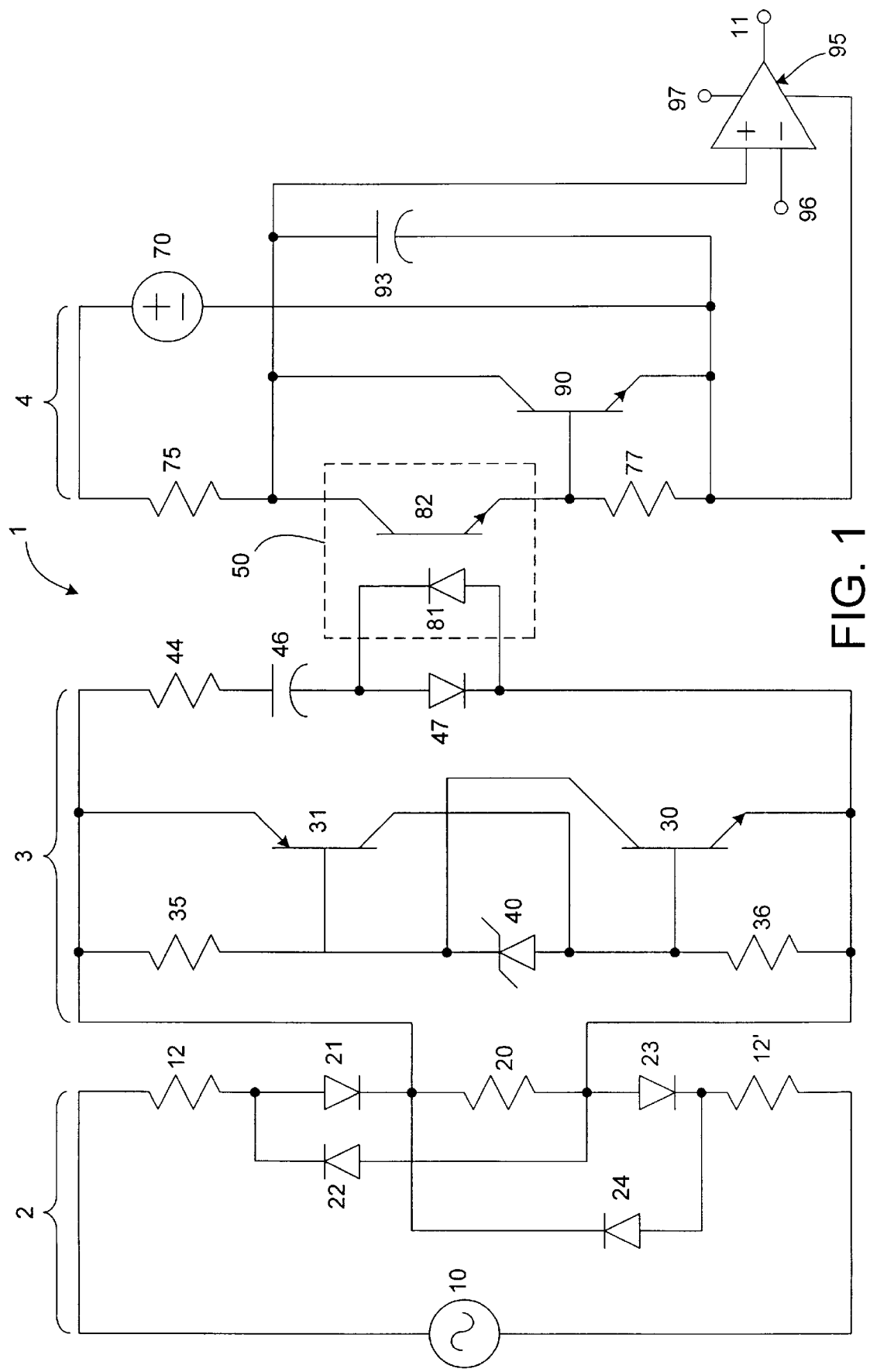
FIG. 1 is a circuit schematic of an embodiment of the present invention.

The present invention will now be described in relation to the drawings, wherein like reference numerals designate like parts. Referring initially to FIG. 1, shown is a circuit diagram of a first embodiment of the present invention.

As shown in FIG. 1, a circuit 1 provides a warning of the loss of power from an AC mains power supply. The circuit 1 includes three successive stages 2–4 and an optical coupler 50. The initial stage 2 of circuit 1 rectifies and scales the voltage of AC mains 10. Rectification is provided by four diodes 21–24 which are arranged in a full wave bridge. The voltage scaling is provided by three resistors 12, 12', 20 having the resistances $r_{12}$, $r_{12'}$ and $r_{20}$ respectively. The AC voltage of the AC mains is scaled by the scaling factor $r_{20}/(r_{12}+r_{12'}+r_{20})$. Specifically, the positive current is directed to resistor 20 through diodes 21 and 24 while the negative current is directed to resistor 20 through diodes 22 and 23. The voltage across resistor 20 is applied to the second stage 3.

The second stage 3 includes a pair of transistors 30, 31, a pair of resistors 35, 36, a zener diode 40 and diode 47. The transistors 30, 31 (e.g., bipolar or a PNP and NPN pair) are non-conductive when the instantaneous voltage applied across the zener diode 40 is at or below the zener diode breakdown voltage. When the instantaneous voltage across resistor 20 is sufficiently high enough to reach the breakdown voltage of zener diode 40, current flows in resistors 35 and 26. A further increase in voltage across resistor 20 in the amount of the sum of the base emitter voltages of transistors 30 and 31 causes at least one transistor 30, 31 to become conductive. Once either transistor 30 or 31 becomes conductive as a result of the zener diode breaking down, regenerative action causes the other of the two transistors to also become conductive thereby turning on both transistors.

As a result of transistors 30, 31 and zener diode 40 becoming conductive, capacitor 46 begins to discharge current through resistor 44 and light emitting diode (LED) 81 of optical coupler 50. The current causes LED 81 to generate light which is received by photo transistor 82. Simultaneous with the receipt of light from LED 81, photo transistor 82 conducts through resistor 77 and the base emitter of transistor 90.

Photo transistor 82 of optical coupler 50 is connected to the third stage 4 and serves as the input to the third stage 4.

Figure 3:
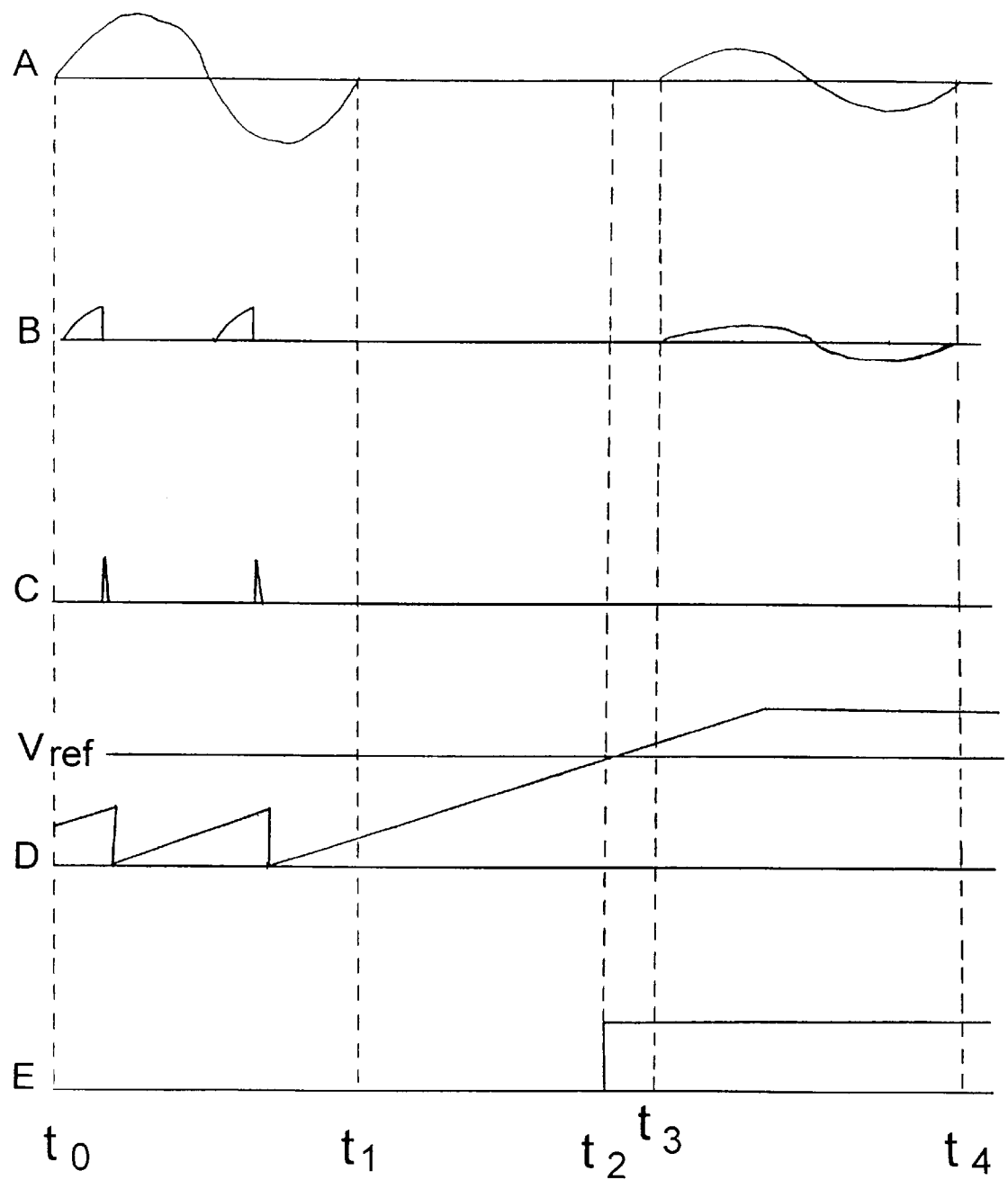
FIG. 3 illustrates the waveforms of the present invention.

The third stage 4 includes a comparator 95, a voltage source 70, a capacitor 93, a transistor 90 and two resistors 75, 77. Photo transistor 82 actuates transistor 90 when conductive so as to cause the discharge of capacitor 93. Waveform D of FIG. 3 illustrates the discharge of capacitor 93. The charging and discharging of capacitor 93 by voltage source 70 is a function of the RC time constant of the resistor 75 and capacitor 93. The values of resistor 75, capacitor 93 and voltage source 70 are selected such that the peak voltage across capacitor 93 does not exceed a reference voltage 96 when AC mains 10 is providing normal power to the circuit 1. The positive terminal of the capacitor 93 is connected to the positive input to a comparator 95 while the negative terminal is connected to the negative power supply of the comparator 95. The positive power supply of comparator 95 is connect to a positive power supply voltage source 97. The other input to comparator 95 is a reference voltage 96 to which the voltage of the positive side of the capacitor 93 is compared. When photo transistor 82 is illuminated by LED 81, the voltage across capacitor 93 is driven to zero volts. However, when LED 81 is not emitting light, photo transistor 82 is in a non-conductive state and thus transistor 90 is turned off and appears as an open circuit causing capacitor 93 to accumulate charge. Accordingly, when the voltage of AC mains 10 is interrupted, the circuit 1 will have an output 11 which will go high indicating a power interruption if the power is not supplied for more than a short period of time. Since output 11 is isolated from AC mains 10 by optical coupler 50, the output 11 can be utilized by another circuit without the need to provide a separate isolation circuit.

Figure 2:
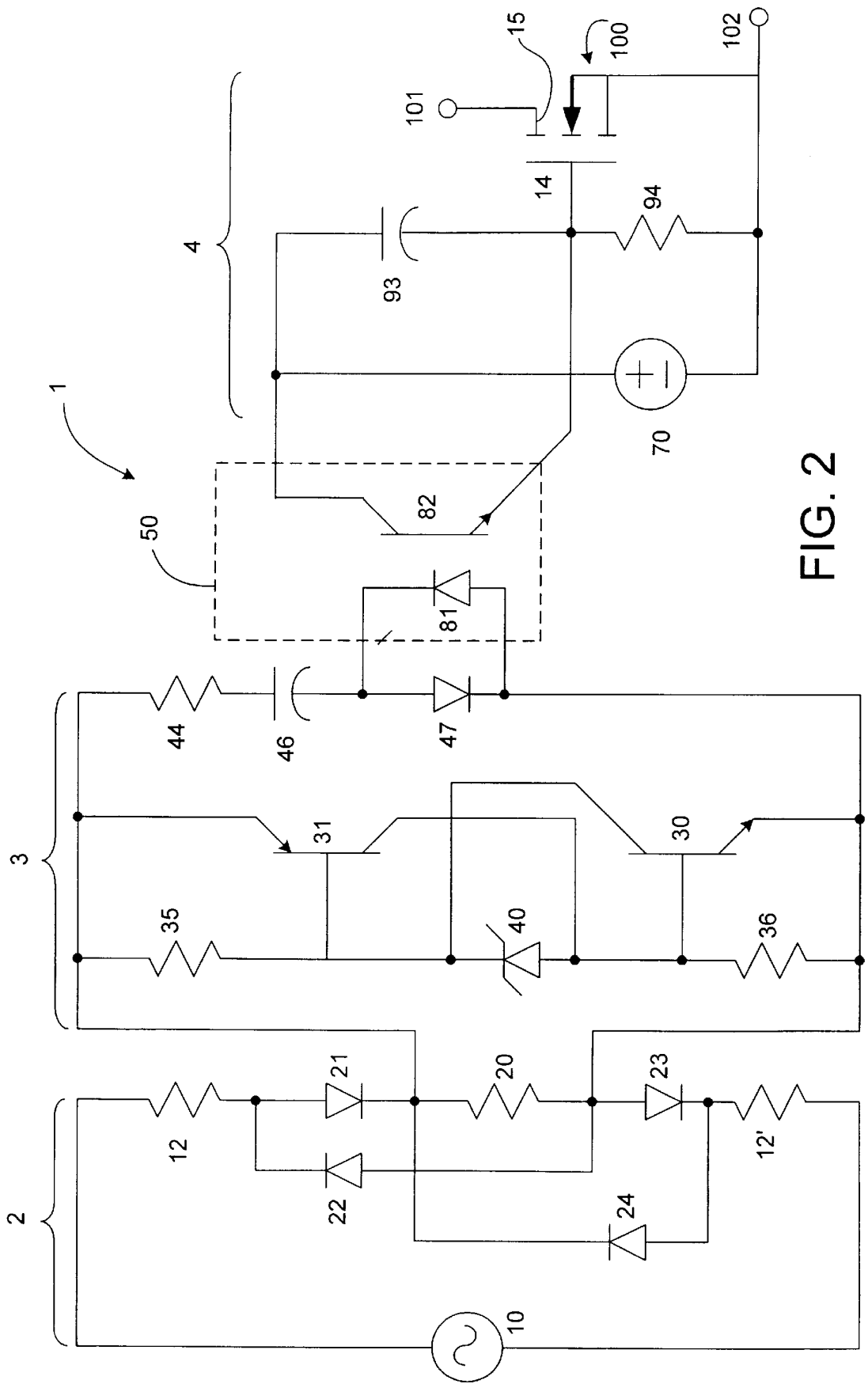
FIG. 2 is a circuit schematic of another embodiment of the present invention.

FIG. 2 illustrates another embodiment of the present invention wherein the first stage, second stage and optical coupler are identical to the embodiment of FIG. 1 and a third stage 4 has a different configuration. The third stage 4 uses a field effect transistor (FET) 100 to provide the comparator function similar to that of FIG. 1. Specifically, voltage is prevented from being applied to the gate 14 of the FET 100 when photo transistor 82 is an open circuit due to LED 81 not emitting light. Capacitor 93 is discharged by illuminated photo transistor 82 and charged by resistor 94 when transistor 82 is not illuminated. The comparison takes place in FET 100 which compares the threshold voltage of gate 14 of FET 100 to difference between the constant voltage supply 70 and the voltage across capacitor 93. Once the threshold voltage of gate 14 is greater than the difference between the constant voltage supply 70 and the voltage across capacitor 93, the impedance of drain 15 increases and thus signals that the voltage of AC mains 10 has dropped below a predetermined level.

FIG. 3 illustrates waveforms of the present invention in connection with the embodiment of FIG. 1, for example. Waveform A is the voltage of AC mains 1 0. As shown, AC mains is providing a voltage to the circuit 1 during $t_0$–$t_1$, is not providing a voltage (the power failure condition) between $t_1$–$t_3$, and is providing insufficient voltage (the brown out condition) between $t_3$–$t_4$. Waveform B is the voltage across capacitor 46 and waveform C is the current through capacitor 46. The voltage across capacitor 46 is roughly proportional to the voltage of AC mains 10 except where the voltage exceeds a threshold. Upon exceeding the threshold, the zener diode 40 breaks down and the voltage across capacitor 46 is quickly discharged resulting in the current spikes in waveform C. Waveform D shows the voltage across capacitor 93. As can be seen when AC mains 10 is properly providing a voltage to circuit 1 a sawtooth waveform results. The capacitor 93 is charged via the voltage source 70 and resistor 75, and is periodically discharged by the transistor 90 in conjunction with the current spikes shown in waveform C.

However, once the voltage of the AC mains 10 is interrupted by either a power failure or brown out, the voltage across capacitor 93 is no longer discharge and eventually becomes fully charged. Waveform E is the output voltage 11 of comparator 95 which indicates whether or not an interruption of the AC mains has occurred. Since the voltage across capacitor 93 does not exceed reference voltage 96 until $t_2$, the output voltage 11 of comparator 95 is in the "off" state (i.e. the state indicating a properly functioning AC mains 10) from $t_0$–$t_2$. At $t_2$ the voltage across capacitor 93 is no longer below the reference voltage 96 and the output voltage 11 of comparator 95 changes to the "on" state (i.e. the state indicating a failure of AC mains 10).

In the drawings and specification there has been disclosed various preferred embodiments of the invention, and although specific terms are employed they are used in a generic and descriptive sense only and not for the purpose of limitation. The scope of the claims being set forth in the following claims.

What has been described above are preferred embodiments of the present invention. It is, of course not possible to describe every conceivable combination of components or methodologies for purposes of describing the present invention, but one of ordinary skill in the art will recognize that many further combinations and permutations of the present invention are possible. Accordingly, the present invention is intended to embrace all such alterations modifications and variations that fall within the spirit and scope of the appended claims. Also, several embodiments and features are described above and are illustrated in respective drawing figures; it will be appreciated that the features described and illustrated with respect to a given embodiment may be used or incorporated in one or more other embodiments.

That which is claimed, follows:

1. A circuit for detecting interruption of an AC mains comprising:
   a level detection circuit for producing a level detection signal indicative of when a predefined level of the AC mains is present;
   a charge circuit which charges as a function of the level detection signal; and
   a comparator for comparing an output of the charge circuit with a predetermined reference to produce a comparator output indicative of whether the AC mains has been interrupted,
   wherein regenerative action in the level detecting circuit causes the charge circuit to discharge.

2. The circuit of claim 1, wherein the charge circuit comprises a capacitor and a transistor operatively configured to control charging of the capacitor in response to the level detection signal.

3. The circuit of claim 1, wherein the comparator is implemented by a field effect transistor.

4. The circuit according to claim 1, wherein the level detection signal is derived exclusively from power provided by the AC mains.

5. The circuit of claim 1, wherein the charge circuit and comparator are operatively configured to indicate the AC mains has been interrupted only after a predetermined period of time following initial interruption.

6. A circuit for detecting interruption of an AC mains comprising:
   a level detection circuit for producing a level detection signal indicative of when a predefined level of the AC mains is present;

a charge circuit which charges as a function of the level detection signal; and a comparator for comparing an output of the charge circuit with a predetermined reference to produce a comparator output indicative of whether the AC mains has been interrupted; and an optoisolator between the level detection circuit and the charge circuit.

7. A circuit for detecting interruption of an AC mains comprising:

a level detection circuit for producing a level detection signal indicative of when a predefined level of the AC mains is present;

a charge circuit which charges as a function of the level detection signal; and a comparator for comparing an output of the charge circuit with a predetermined reference to produce a comparator output indicative of whether the AC mains has been interrupted;

wherein the charge circuit is periodically discharged in response to the level detection signal under circumstances in which the AC mains has not been interrupted, and charges to at least a predetermined level under circumstances in which the AC mains has been interrupted.

8. A circuit for detecting interruption of an AC mains comprising:

a level detection circuit for producing a level detection signal indicative of when a predefined level of the AC mains is present;

a charge circuit which charges as a function of the level detection signal;

a comparator for comparing an output of the charge circuit with a predetermined reference to produce a comparator output indicative of whether the AC mains has been interrupted; and a full wave rectifier for rectifying the AC mains, and wherein the level detection circuit comprises a zener diode coupled to the output of the full wave rectifier which breaks down every half cycle of the AC mains, provided the predefined level of the AC mains is present, to produce the level detection signal.

9. The circuit of claim 8, further comprising an optoisolator for coupling the level detection signal to the charge circuit.

10. A circuit for detecting interruption of an AC mains comprising:

a level detection circuit for producing a level detection signal indicative of when a predefined level of the AC mains is present;

a charge circuit which charges as a function of the level detection signal; and a comparator for comparing an output of the charge circuit with a predetermined reference to produce a comparator output indicative of whether the AC mains has been interrupted wherein the comparator output is isolated from the AC mains.

11. A method for detecting interruption of an AC mains comprising:

producing a level detection signal with a level detection circuit indicative of when a predefined level of the AC mains is present;

charging a charge circuit as a function of the level detection signal; and comparing an output of the charge circuit with a predetermined reference to produce a comparator output indicative of whether the AC mains has been interrupted, wherein regenerative action in the level detecting circuit causes the charge circuit to discharge.

12. The method of claim 11, wherein the comparing is performed by a field effect transistor.

13. The method according to claim 11, wherein the level detection signal is derived exclusively from power provided by the AC mains.

14. The method of claim 11, wherein comparator output indicative of whether the AC mains has been interrupted indicates interruption of the AC mains only after a predetermined period of time following initial interruption.

15. A method for detecting interruption of an AC mains comprising:

producing a level detection signal with a level detection circuit indicative of when a predefined level of the AC mains is present; and charging a charge circuit as a function of the level detection signal; and comparing an output of the charge circuit with a predetermined reference to produce a comparator output indicative of whether the AC mains has been interrupted;

wherein the comparator output is isolated from the AC mains.

16. A method for detecting interruption of an AC mains comprising:

producing a level detection signal with a level detection circuit indicative of when a predefined level of the AC mains is present; and charging a charge circuit as a function of the level detection signal;

comparing an output of the charge circuit with a predetermined reference to produce a comparator output indicative of whether the AC mains has been interrupted; and electrically isolating the level detection circuit from the charge circuit with an optoisolator.

17. A method for detecting interruption of an AC mains comprising:

producing a level detection signal with a level detection circuit indicative of when a predefined level of the AC mains is present; and charging a charge circuit as a function of the level detection signal;

comparing an output of the charge circuit with a predetermined reference to produce a comparator output indicative of whether the AC mains has been interrupted; and periodically discharging the charge circuit in response to the level detection signal when the AC mains has not been interrupted, and charging to at least a predetermined level when the AC mains has been interrupted.

18. A method for detecting interruption of an AC mains comprising:

producing a level detection signal with a level detection circuit indicative of when a predefined level of the AC mains is present;

charging a charge circuit as a function of the level detection signal;

comparing an output of the charge circuit with a predetermined reference to produce a comparator output indicative of whether the AC mains has been interrupted; and a full wave rectification of the AC mains to produce a rectified AC mains signal, and wherein the level detection circuit comprises a zener diode coupled to the rectified AC mains signal which breaks down every half cycle of the AC mains, provided the predefined level of the AC mains is present, to produce the level detection signal.

19. The method of claim 18, further comprising coupling the level detection signal to the charge circuit with an optoisolator.

20. The method of claim 19, wherein the charge circuit comprises a capacitor and a transistor operatively configured to control charging of the capacitor in response to the level detection signal.

21. A method of warning when an AC voltage source is below a predetermined set point comprising the steps of:

inputting an AC voltage;

essentially from the AC voltage, producing a voltage level output in accordance with the level of the AC voltage as compared to a threshold voltage; and producing an AC voltage failure output in accordance with the time the voltage level output has been below the threshold voltage, wherein the producing a voltage level output in accordance with the level of the AC voltage includes regenerative action.

22. A circuit for detecting interruption of an AC mains signal from an AC mains comprising:

a level detection circuit for producing a level detection signal indicative of when a predefined level of the AC mains is present, the level detection circuit including a breakdown device;

a charge circuit which charges as a function of the level detection signal; and a comparator for comparing an output of the charge circuit with a predetermined reference to produce a comparator output indicative of whether the AC mains has been interrupted, wherein the AC mains signal is coupled across the breakdown device and the level detection signal is based on a breakdown of the breakdown device.

23. The circuit according to claim 22, wherein the level detection signal is derived exclusively from power provided by the AC mains.

24. A method for detecting interruption of an AC mains comprising:

producing a level detection signal indicative of when a predefined level of the AC mains is present as a result of coupling the AC mains across a breakdown device;

charging a charge circuit as a function of the level detection signal; and comparing an output of the charge circuit with a predetermined reference to produce a comparator output indicative of whether the AC mains has been interrupted.

25. The method of claim 24, wherein the level detection signal is derived exclusively from power provided by the AC mains.

* * * * *